(12) United States Patent
den Boef

(10) Patent No.: US 6,384,899 B1
(45) Date of Patent: May 7, 2002

(54) LITHOGRAPHIC PROJECTION APPARATUS

(75) Inventor: Arie J. den Boef, Waalre (NL)

(73) Assignee: ASM Lithography B.V., Veldhoven (NL)

( * ) Notice: Subject to any disclaimer, the term of this patent is extended or adjusted under 35 U.S.C. 154(b) by 0 days.

(21) Appl. No.: 09/496,406

(22) Filed: Feb. 2, 2000

(30) Foreign Application Priority Data

Feb. 4, 1999 (EP) .............................................. 99200324

(51) Int. Cl.[7] ........................ G03B 27/72; G03B 27/42; G03B 27/54; G01B 9/02
(52) U.S. Cl. ............................... 355/69; 355/53; 355/67; 356/450; 356/486; 356/493
(58) Field of Search ............................... 355/53, 67, 69; 356/345, 349, 351, 363, 493, 486, 450, 489, 495, 487; 33/DIG. 4

(56) References Cited

U.S. PATENT DOCUMENTS

| | | | | |
|---|---|---|---|---|
| 3,905,703 A | * | 9/1975 | Matsumoto | 356/450 |
| 4,865,450 A | * | 9/1989 | Munechia et al. | 356/489 |
| 5,189,547 A | | 2/1993 | Day | 359/245 |
| 5,298,971 A | * | 3/1994 | Huang et al. | 356/520 |
| 5,377,006 A | * | 12/1994 | Nakata | 356/486 |
| 5,469,259 A | * | 11/1995 | Golby et al. | 356/495 |
| 5,479,238 A | * | 12/1995 | Whitney | 355/53 |
| 5,706,084 A | * | 1/1998 | Gutierrez | 356/493 |
| 5,721,607 A | * | 2/1998 | OtA | 355/53 |
| 5,872,629 A | * | 2/1999 | Colvard | 356/487 |
| 5,995,207 A | * | 11/1999 | Hall et al. | 356/5.09 |

* cited by examiner

Primary Examiner—Russell Adams
Assistant Examiner—Rodney Fuller
(74) Attorney, Agent, or Firm—Pillsbury Winthrop LLP

(57) ABSTRACT

In an interferometric alignment system provides an alignment signal for reproducibly registering a reticle 10 with a wafer 12. The radiation from a laser 50, which is the illumination source for the interferometer, is modulated by a phase modulator 52 to eliminate spurious noise from the alignment signal.

14 Claims, 6 Drawing Sheets

LITHOGRAPHIC PROJECTION APPARATUS

The present invention relates to a lithographic projection apparatus comprising:
- a radiation system for supplying a projection beam of radiation;
- a mask table provided with a mask holder for holding a mask;
- a substrate table provided with a substrate holder for holding a substrate;
- a projection system for imaging an irradiated portion of the mask onto a target portion of the substrate.

More specifically, the invention relates to subsystems of such an apparatus which employ coherent light beams, e.g. as produced by a laser. In particular, the invention relates to an interferometric measurement system, especially as employed in an alignment system, a leveling system or a stage-position-measuring system, for example.

Lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies that are successively irradiated through the reticle, one at a time. In one type of lithographic projection apparatus, each die is irradiated by exposing the entire reticle pattern onto the die in one go; such an apparatus is commnonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. More information with regard to lithographic devices as here described can be gleaned from International Patent Application WO 97133205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

The projection radiation in current lithographic devices is generally UV (ultra-violet) light with a wavelength of 365 nm, 248 nm or 193 nm. However, the continual shrinkage of design rules in the semiconductor industry is leading to an increasing demand for new radiation types. Current candidates for the near future include UV light with wavelengths of 157 nm or 126 nm, as well as extreme UV light (EUV) and particle beams; (e.g. electron or ion beams).

Interferometric measurement systems can be employed in a variety of subsystems in a lithographic projection apparatus, for example:
- for the precision alignment of a mask relative to a substrate;
- for the precise leveling of a substrate and/or mask relative to the projection beam, as directed onto a particular target area of the substrate;
- for the accurate determination of position, velocity and/or acceleration of the substrate and/or mask stages.

In one example of an interferometric measurement system, a coherent light beam is divided into two beams, for example by a diffraction grating provided on a first component (e.g. a reticle). The two beams are then recombined to form an interference pattern that impinges on a transmission grating provided on a second component (e.g. a wafer). The coincidence of the interference pattern and the second grating produces a Moire pattern. The total transmitted intensity varies with the phase of the Moire pattern, which is in turn a function of the relative displacement of the first and second components. Therefore, the relative positions of the components can be determined with high resolution by detecting the overall transmitted intensity.

It should be explicitly noted that the projection radiation used in the lithographic projection apparatus may be of a different type or wavelength to the coherent light beam used in an interferometric measurement system as hereabove described. For example, in the case of a DUV projection apparatus, the projection wavelength is 248 nm, but the alignment system, leveling system and stage-position-measurement system often employ radiation from a HeNe laser (wavelength=632 nm), or a diode laser, for example.

In an interferometric measurement system as here described, it is important that the positions of the said first and second components can be determined reproducibly (e.g. so that registration marks are correctly aligned for different exposures). However, considerable problems can be caused by the presence of noise in the measurement signal produced by the system, which can lead to poor reproducibility and reduced measurement precision (in turn leading to significant errors in such factors as overlay performance, focus, and scan synchronization, for example).

It is an object of the invention to alleviate this problem.

Accordingly, the presently invention provides an optical measurement system comprising:
- a source of substantially coherent radiation;
- a detector for detecting a desired signal resulting from interference between beams derived from said source, characterized by a phase modulator for modulating the phase of radiation emitted by said radiation source, whereby detection of at least one spurious signal, caused by interference from at least one spurious beam in the optical measurement system, is suppressed.

In experiments leading to the invention, the present inventors determined that noise in the measurement signal of such an optical measurement system can be caused by the presence of a spurious radiation beam, e.g. arising from:
- an unmasked reflection at an air/glass interface within the (typically) complex projection lens of the lithographic projection apparatus, or within other optical systems, e.g. as used in the radiation system or alignment system;
- a similar reflection occurring at the reticle.

However, the precise location of such a reflection is generally difficult to determine. Moreover, the provision of anti-reflection coatings on the optical components of the apparatus does not generally provide an effective cure of this problem.

Advantageously, the present invention enables the noise signal to be substantially eliminated without any modification to the detection system: it is only necessary to provide a phase modulator in the radiation source beam path.

Preferably, the phase modulator comprises a controllable attenuator for sequentially modulating the radiation at a plurality of modulation amplitudes. This has the advantage of enabling additional spurious signals to be suppressed, and of allowing suppression of noise signals caused by spurious reflections at a range of different positions within the optical measurement system.

Preferably the phase modulator comprises an electro-optic element, such as an $LiNbO_3$ element, for example. A modulator as here discussed is described, for example, in U.S. Pat. No. 5,189,547, which is incorporated herein by reference.

The above aspects of the invention will be explained thoroughly in the Embodiments below.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

Exemplary embodiments of the invention will now be described with reference to the accompanying schematic drawings, in which:

FIG. 1 schematically depicts a lithographic projection apparatus embodying the invention;

EMBODIMENT 1

Figure 1:
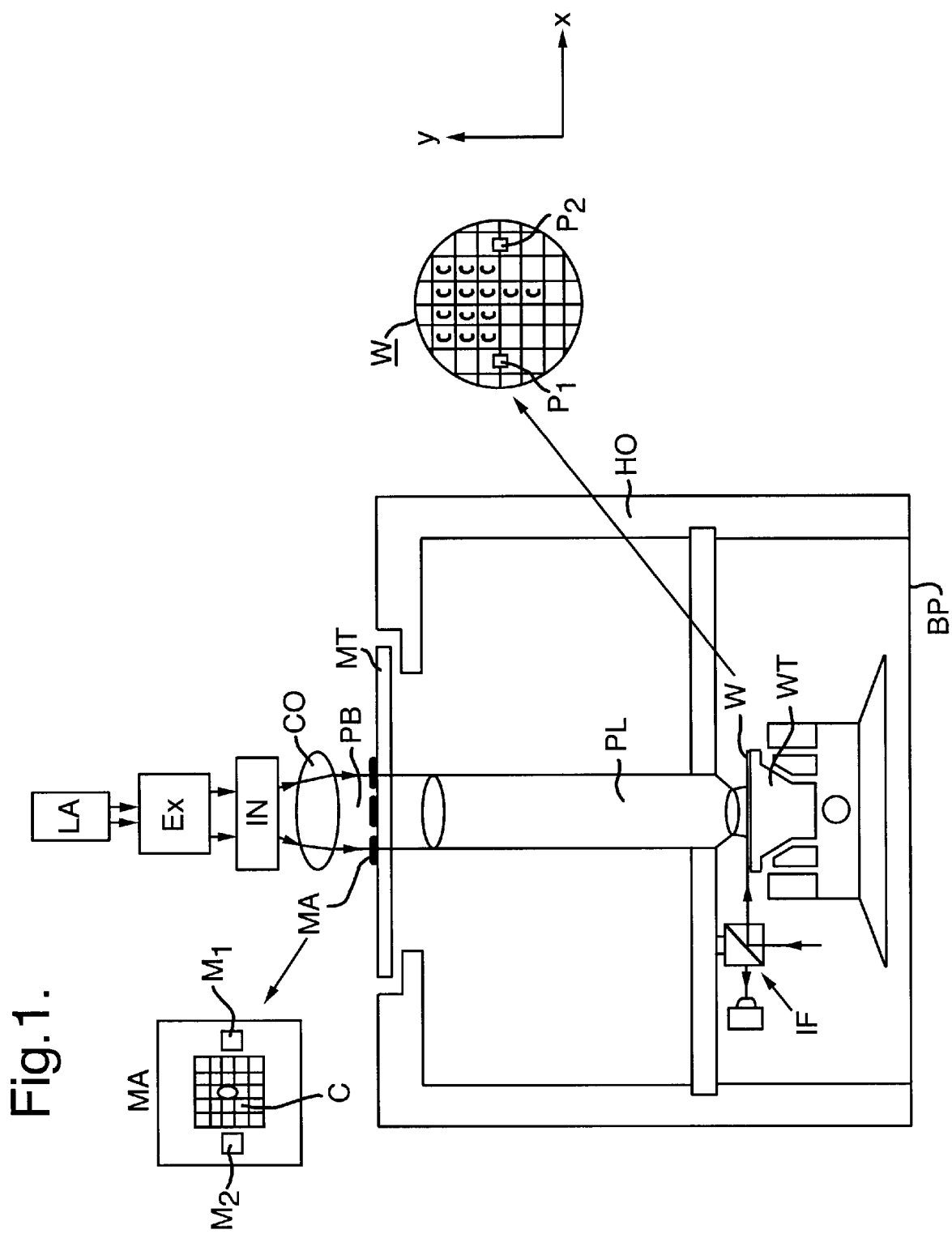

The present invention will first be discussed in general terms, before more specific embodiments are discussed in more detail.

Noise in the detected interference signal can seriously degrade the performance of interferometric measurement systems. It has been found through investigation that a cause of the apparent noise can be a spurious reflection within the apparatus. The spurious reflected beam can interfere with the desired interfering beams to produce a noise signal. The effect of phase-modulating the interferometer radiation, such as laser light, has been investigated by the present inventors. In an interferometric measurement system, the measured signal intensity (I) is formed by the interference of two coherent laser beams with complex amplitudes $E_1$ and $E_2$:

$$I = |E_1 + E_2|^2$$
$$= |E_1|^2 + |E_2|^2 + 2|E_1||E_2|\cos(\varphi_1 - \varphi_2)$$

where $\Phi_1$ and $\Phi_2$ are the phases of the two interfering beams, whose difference is given by:

$$\Phi_1 - \Phi_2 = \upsilon_L t_{12} + \phi_L(t-t_1) - \phi_L(t-t_2) \quad [1]$$

where $\upsilon_L$ is the average optical angular frequency of the laser light, $t_{12}$ is the time difference between the beams and $\upsilon_L$ is the phase modulation of the laser light at angular frequency $\Omega$ and amplitude $\hat{\phi}_L$, given by:

$$\phi_L = \hat{\phi}_L \cos(\Omega t) \quad [2]$$

Substituting [2] into equation [1] yields the following expression for the phase difference between the interfering beams:

$$\Phi_1 - \Phi_2 = \upsilon_L t_{12} + a_{12} \cos(\Omega t + \alpha) \quad [3]$$

where the modulation amplitude $a_{12}$ of the phase difference between the interfering beams is given by:

$$a_{12} = \hat{\phi}_L \sqrt{2 - 2\cos(\Omega t_{12})} \quad [4]$$
$$= \hat{\phi}_L \sqrt{2 - 2\cos\left(\Omega \frac{PD_{12}}{c}\right)}$$

where $PD_{12}$ is the optical path difference between the two interfering beams, and c is the speed of light. Equation [4] establishes the relation between the amplitude of the phase modulation of the laser light ($\hat{\phi}_L$) and the amplitude of the phase modulation of the interference pattern ($a_{12}$). Substituting [3] into equation [1] gives the detected interference signal:

$$I = |E_1 + E_2|^2$$
$$= |E_1|^2 + |E_2|^2 + 2|E_1||E_2|\cos(v_L t_{12} + a_{12}\cos(\Omega t))$$

Expanding this expression as a Fourier series (i.e. a frequency spectrum) yields:

$$I = |E_1|^2 + |E_2|^2 + 2|E_1||E_2|\cos(v_L t_{12})J_0(a_{12}) +$$

$$2|E_1||E_2| \times \left[ \cos(v_L t_{12}) \sum_{m=1}^{\infty} (-1)^m J_{2m}(a_{12}) \cos(2m\Omega t) + \right.$$

$$\left. \sin(v_L t_{12}) \sum_{m=1}^{\infty} (-1)^m J_{2m+1}(a_{12}) \cos((2m+1)\Omega t) \right]$$

where $J_i(a)$ is a Bessel function of the first kind and of order i.

A significant feature of this expression is that the amplitude of the $i^{th}$ harmonic scales with $J_i(a)$. Thus for specific values of a, the amplitude of the so-called "base band signal", $$2|E_1||E_2|\cos(v_L t_{12})J_0(a)$$

becomes zero.

In a practical system, the optical components have an anti-reflection (AR) coating to minimize spurious reflections, such as at glass-air interfaces. However, even the best AR coatings show a small residual reflection that may give rise to an additional beam with a small complex amplitude $E_3$ and a phase $\Phi_3$. The measured signal then becomes:

$$I = |E_1 + E_2 + E_3|^2$$
$$= |E_1|^2 + |E_2|^2 + |E_3|^2 + 2|E_1||E_2|\cos(\varphi_1 - \varphi_2) +$$
$$2|E_1||E_3|\cos(\varphi_1 - \varphi_3) + 2|E_2||E_3|\cos(\varphi_2 - \varphi_3)$$

The last two terms on the right-hand side of this equation are noise terms that cause errors in the determination of $\phi_1 - \phi_2$, which is of course the desired interference signal to be measured. If the path difference between $E_1$ and $E_2$ is small (such as up to a few 100 $\mu$m), which it will be in practice, the phase modulation $\phi_L$ will have no significant impact on the desired interference term. However, if as is likely, the spurious reflection has a significant path difference with respect to the first two beams, then the two spurious interference terms will show a significant phase modulation with an amplitude given by equation [4], i.e.

$$a_{13} \approx a_{23} = a = \hat{\varphi}_L \sqrt{2 - 2\cos\left(\Omega \frac{PD_s}{c}\right)} \quad [5]$$

where PDs is the optical path difference between the spurious beam and either of the primary beams.

To suppress the base-band signal, the value of a must be such that $J_0(a)=0$. The Bessel function has multiple zeros, one of which is at a≈2.4. Substituting this into equation [5] gives a relation between the frequency $\Omega$ and the modulation amplitude $\hat{\phi}_L$ of the phase modulation that will suppress the base band signal:

$$\hat{\varphi}_L = \frac{2.4}{\sqrt{2 - 2\cos\left(\Omega \frac{PD_s}{c}\right)}} \quad [6]$$

Thus, by phase modulating the radiation from the radiation source for the interferometer, and by an appropriate choice of the modulation frequency and amplitude, it is possible to reduce substantially the noise in the measured signal. For example, if the total path difference is about 60 mm and the modulation frequency is 500 MHz, the amplitude of the phase modulation must be about 1.4 rad (≈81°).

EMBODIMENT 2

A lithographic projection apparatus according to the invention will now be described. In this regard, FIG. 1 schematically depicts a lithographic projection apparatus comprising:
- a radiation system LA, Ex, IN, CO for supplying a projection beam PB of radiation (e.g. UV or EUV radiation, electrons or ions);
- a movable mask stage (reticle stage) MT provided with a mask holder for holding a mask (reticle) MA, and connected to mask stage positioning means PM for accurately positioning the mask with respect to item PL;
- a movable substrate stage (wafer stage) WT provided with a substrate holder for holding a substrate W (e.g. a resist-coated silicon wafer), and connected to substrate stage positioning means PW for accurately positioning the substrate with respect to item PL;
- a projection system PL (e.g. a refractive or catadioptric system, a mirror group or an array of field deflectors) for imaging an irradiated portion of the mask MA onto a target portion C (die) of the substrate W. For simplicity, item PL may be referred to as the "lens".

The radiation system comprises a source LA (e.g. a Hg lamp or excimer laser, or a source of EUV or particulate radiation) which produces a beam of radiation. This beam is passed along various optical components,—e.g. beam shaping optics Ex, an integrator IN and a condenser CO—so that the resultant beam PB has a desired intensity profile and shape in its cross-section.

The beam PB subsequently intercepts the mask MA which is held in a mask holder on the mask stage MT. Having passed through the mask MA, the beam PB passes through the lens PL, which focuses the beam PB onto a target area C of the substrate W. With the aid of interferometric displacement and measuring means IF, the substrate stage WT can be moved accurately, e.g. so as to position different target areas C in the path of the beam PB. Similarly, positioning means (not depicted) can be used to accurately position the mask MA with respect to the path of the beam PB, e.g. after mechanical retrieval of the mask MA from a mask library, or during a mask scan. In general, movement of the stages MT, WT will be realized with the aid of a long stroke module (course positioning) and a short stroke module (fine positioning), which are not explicitly depicted in FIG. 1. In the case of a waferstepper—as opposed to a step-and-scan device—the mask table MT may be provided with only a short-stroke module, for fine positioning.

The depicted apparatus can be used in two different modes:

In step mode, the mask stage MT is kept essentially stationary, and an entire mask image is projected in one go (i.e. a single "flash") onto a target area C. The substrate stage WT is then shifted in the x and/or y directions so that a different target area C can be irradiated by the beam PB;

In scan mode, essentially the same scenario applies, except that a given target area C is not exposed in a single "flash". Instead, the mask stage MT is movable in a given direction (the so-called "scan direction", e.g. the x direction) with a speed v, so that the projection beam PB is caused to scan over a mask image; concurrently, the substrate stage WT is simultaneously moved in the same or opposite direction at a speed V=Mv, in which M is the magnification of the lens PL (typically, M=¼ or ⅕). In this manner, a relatively large target area C can be exposed, without having to compromise on resolution.

In general, each target portion C of the substrate W will be subjected to various exposures, in successive irradiation sessions. These exposures will typically result in patterned layers (e.g. the circuit patterns in the various semiconductor layers of an IC) which will have to be accurately overlapped with one another (with a so-called "overlay precision" that is often of the order of nanometers). In this context, it will be appreciated that highly accurate (re-)positioning of the substrate table WT and the mask table MT is of exceptional importance. To this end, the alignment system, leveling system and stage-position-measurement system of the lithographic projection apparatus must allow accurate and reproducible measurements. Such systems are well known in the field of projection lithography, so that a detailed discussion of their operating principles will not be given here; for further information, the reader is, for example, directed to U.S. patent application Ser. No. 09/114,748 (corresponding to WO 99/32940), which is incorporated herein by reference.

EMBODIMENT 3

Figure 2:
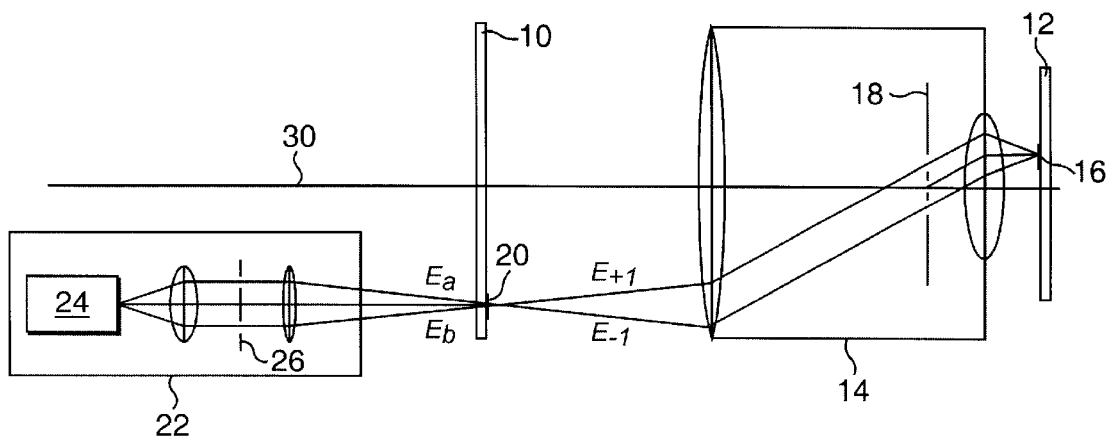
FIG. 2 is a schematic diagram of relevant components of a lithographic projection apparatus to which the present invention is applied.

FIG. 2 shows schematically an example of an interferometric optical alignment system for the lithographic projection apparatus of FIG. 1. This apparatus is for projecting a pattern on a reticle 10 onto a wafer 12, in order to expose a photosensitive resist coating on the wafer to the desired pattern. It is important to achieve reproducible registration between the reticle 10 and wafer 12, especially when overlaying a new pattern onto a wafer that has previously been exposed and patterned. The depicted alignment system is a through-the-lens (TTL) system in that it uses some of the same optics as the exposure system of the lithographic projection apparatus, in particular the projection lens system 14.

An illumination beam (15) from a laser source, such as a HeNe laser emitting red light with a wavelength of 632.8 nm, falls on wafer grating 16, also called an alignment marker, but does not expose the resist coating because the resist is sensitive only to ultraviolet light. The wafer grating 16 has, in this case, a period of 16 μm and produces reflected diffraction orders. With the exception of the +1 and −1 diffraction orders, all diffracted beams are blocked by a spatial filter 18 built into the projection lens 14.

The +1 and −1 diffraction orders (indicated by $E_{+1}$ and $E_{-1}$) that are transmitted by the projection lens 14 form a sinusoidal intensity interference pattern on the reticle 10 in the vicinity of the reticle grating 20. The reticle grating 20 is a transmission grating with a period of 32 μm, for example. The interference fringes and reticle grating 20 form a Moiré pattern, and thus the intensity of light transmitted through grating 20 varies harmonically with the position of the wafer grating 16. By measuring the phase of the Moiré pattern (i.e. transmitted intensity), the position of the wafer grating 16 can be measured. The intensity is measured in the alignment detection block 22 by detector 24. The spatial filter 26 built into the alignment detection block 22 is used to block higher diffraction orders of the reticle grating 20.

In practice, there are many glass-air interfaces at which spurious reflections can occur, such as in the projection lens system, in the illuminator, in optical elements of the alignment system, and on the reticle. It is difficult to determine precisely which interface gives rise to a problematic reflection, but a particular partial reflection of the illumination beam in the projection lens element 28, for example, is illustrated schematically in FIG. 3.

The reflected beam is labeled $E_L$ and investigations have found that it can pass through the spatial filter 18 because it is practically coincident with the −1 order diffracted beam. The direction of $E_L$ also means that it falls on the reticle grating 20 slightly laterally shifted with respect to $E_{-1}$. The highly coherent nature of the laser light means that the spurious reflected beam $E_L$ will interfere with the $E_{+1}$ and $E_{-1}$ beams at the reticle 10.

The form of the intensity measured by the detector 24 can be calculated by considering the interference between the beams $E_a$ and $E_b$ diffracted by the reticle grating 20 (see FIG. 2). The beams $E_a$ and $E_b$ have components resulting from each of the incident beams $E_{+1}$, $E_{-1}$ and $E_L$. The $E_{+1}$ and $E_{-1}$ beams have a phase shift proportional to the position of the wafer grating 16 in the x direction, which is transverse to the optical axis 30 of the apparatus, viz. the vertical direction in FIGS. 2 and 3. The spurious reflected beam $E_L$ does not have this x-dependent phase shift, but does have a relative phase shift with respect to the other two beams which is proportional to the optical path, being approximately twice the distance Z from the projection lens 28 to the wafer 12.

Making certain assumptions about the profile of the transmission grating and the diffraction efficiencies of the different orders yields the following approximate expression for the relative intensity at the detector 24:

$$\frac{I_t}{I} = (1 + R) + \cos\left(4\pi \frac{x}{X_P}\right) + 2\sqrt{R}\, \cos\left(2\pi \frac{x}{X_P}\right)\cos(\Delta\varphi) \quad [7]$$

wherein the symbols used have the following meaning:
$I_t$ total intensity at the detector
I intensity of the +1 and −1 diffracted orders incident on the reticle
R reflection coefficient of the spurious reflection normalized to the diffraction efficiency of the wafer grating (alignment marker) 16
x position of the wafer grating/marker 16 (and hence the wafer 12)
$X_P$ period of the wafer grating 16 (16 μm in this particular case)
Δϕ(λ, Z) phase difference between the spurious reflected beam $E_L$ and the first-order diffracted beams $E_{+1}$ and $E_{-1}$ (shown as a function of Z and λ)
Z distance between the wafer and the reflecting lens element
λ wavelength of the laser light.

Figure 4A:
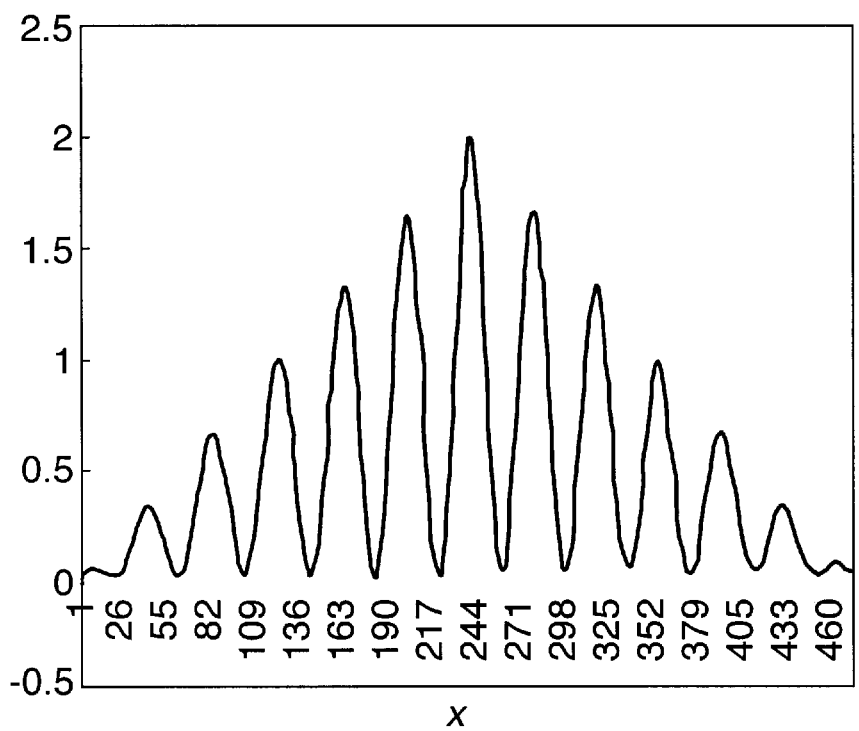
FIGS. 4A, 4B and 4C illustrate examples of detected alignment signals and problems therewith.

In the ideal situation, there is no reflected beam, i.e. R=0, and it can be seen from equation [7] that the detected intensity signal at the detector simply varies harmonically with x. In practice, the wafer grating 16 has a finite width, and if the reticle grating 20 and the image of the wafer grating have the same width, then the detected intensity has a triangular profile. The full width of the triangle is equal to the marker (grating 16) width. The actual resulting alignment signal intensity is plotted vertically against position x in FIG. 4A.

Figure 4B:
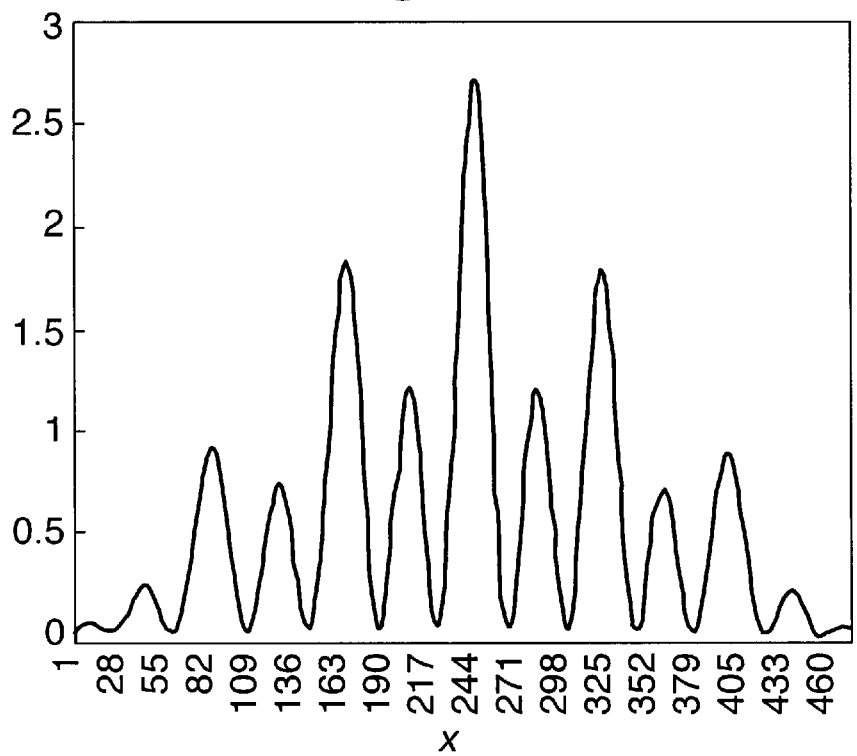
Figure 4C:
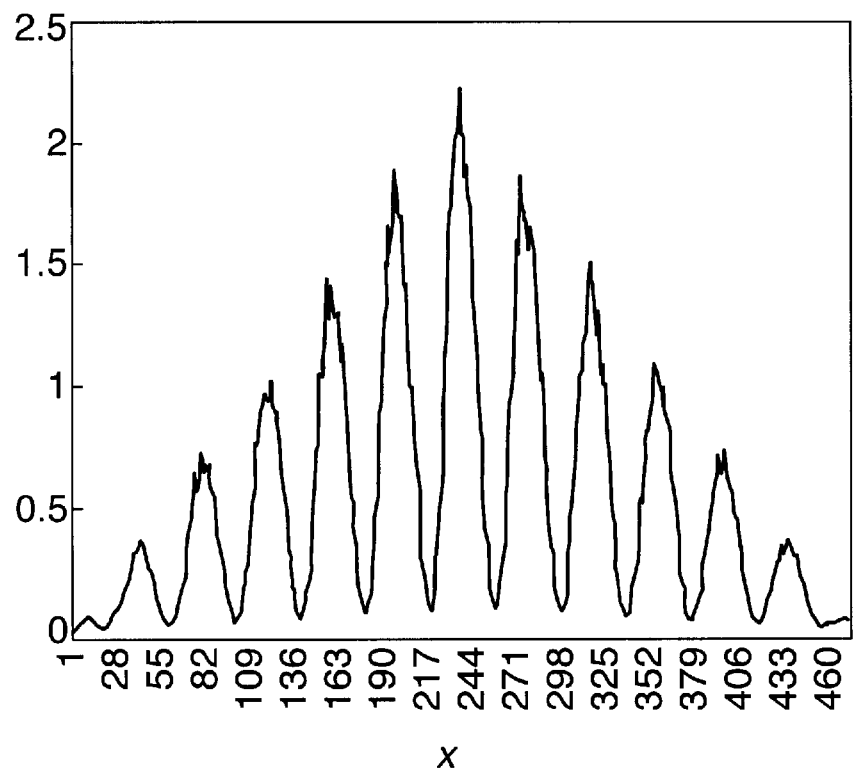

When R is non-zero, it can be seen from equation [7] that there is a term proportional to $\sqrt{R}$ that varies with x, but at half the frequency of the desired signal. FIG. 4B shows the detected alignment signal for R=0.1 and $\Delta\phi=0$ (or $n\pi$) such that $\cos(\Delta\phi)$ is unity, but with added white phase noise with an amplitude of 0.6 rad. The presence of the sub-harmonic signal can clearly be seen, but the noise is barely apparent. FIG. 4C shows the alignment signal for the case R=0.1, but with the average phase $\Delta\phi=(\pi/2)+n\pi$, again with 0.6 rad white noise added to $\Delta\phi$. In this case the average amplitude of the sub-harmonic is zero. However, for this average phase, the conversion of phase noise to amplitude noise is maximum, and the noise is visible.

The phase difference can be written as:

$$\Delta\varphi = 2\pi \frac{PD_s}{\lambda} = 4\pi \frac{Z}{\lambda} \quad [8]$$

where the optical path difference $PD_s=2Z$.

From this, and the above analysis that the noise in the alignment signal is maximum every $n\pi$, it follows that the noise in the alignment signal must vary periodically as a function of Z, with a period equal to a quarter of the wavelength of the laser light (in this example $\alpha/4\approx158$ nm). This periodicity has been observed experimentally by plotting the alignment reproducibility as a function of the Z position (defocus) of the wafer 12. This provides confirmation that the noise is indeed due to a spurious reflection in the apparatus.

Equation [8] may be rewritten as:

$$\Delta\varphi = 4\pi \frac{Z(t)}{c} f(t)$$

where f is the laser frequency. The terms Z and f are written explicitly as functions of time, and it is these temporal variations that give rise to alignment noise. Fluctuations in Z can be caused by vibrations of the wafer stage. For example, vibrations of the wafer stage in the z-direction itself may be typically of the order of 30 nm, which results in 0.6 rad phase noise in $\Delta\phi$, and oscillations about the y-axis may be about 1 μrad, leading to 0.3 rad phase noise in $\Delta\phi$, the noise values given representing the 3 standard deviation range. The statistical combination of these wafer stage vibrations results in 0.67 rad phase noise in $\Delta\phi$. The laser frequency can also show variations caused by (i) frequency variations of a single longitudinal laser mode (of the order of 10 MHz) and (ii) mode-hopping between two longitudinal modes (mode spacing typically 300 MHz). Vibrations of the wafer table are generally more significant, but the frequency variations can be important in certain circumstances.

The phase difference $\Delta\phi$ may be decomposed into a noise term due to wafer table vibrations $\phi_{WS}$ and a phase modulation purposely introduced into the laser light $\phi_L$:

$$\Delta\phi = \phi_L(t) - \phi_L(t-\tau) + \phi_{WS}(t)$$

where $$\tau = \frac{PD_s}{c} = \frac{2Z}{c}$$

The phase modulation $\phi_L$ is given by equation [2], and analogous manipulation yields:

$$\Delta\varphi = \hat{\varphi}_L \sqrt{2 - 2\cos(\Omega t)} \cos(\Omega t + \alpha) + \varphi_{WS}(t) \quad [9]$$
$$= a\cos(\Omega t + \alpha) + \varphi_{WS}(t)$$

where $\alpha$ is a constant phase term that will be ignored.

The right-hand noise term in equation [7] is proportional to $\cos(\Delta\phi)$; substituting for $\Delta\phi$ from equation [9] into $\cos(\Delta\phi)$ and expanding gives:

$$\cos(\Delta\varphi) = \cos(\varphi_{WS}) J_0(a) + \quad [10]$$
$$2\cos(\varphi_{WS}) \sum_{n=1}^{\infty} (-1)^n J_{2n}(a) \cos(2n\Omega t) -$$
$$2\sin(\varphi_{WS}) \sum_{n=0}^{\infty} (-1)^n J_{2n+1}(a) \cos((2n+1)\Omega t)$$

As previously discussed, the $J_0$ term can be reduced to zero by an appropriate choice of the frequency and amplitude of the phase modulation of the illumination light, and hence an appropriate value of a, given by equation [5]. One solution is given by a=2.4, and the relation, given explicitly in terms of the distance Z between the spurious reflection and the wafer marker, and the frequency F of the phase modulation $\Omega=2\pi F$), is:

$$\hat{\varphi}_L = \frac{2.4}{\sqrt{2 - 2\cos\left(4\pi F \frac{Z}{c}\right)}} \quad [11]$$

There are, of course, other solutions besides a=2.4.

Figure 5:
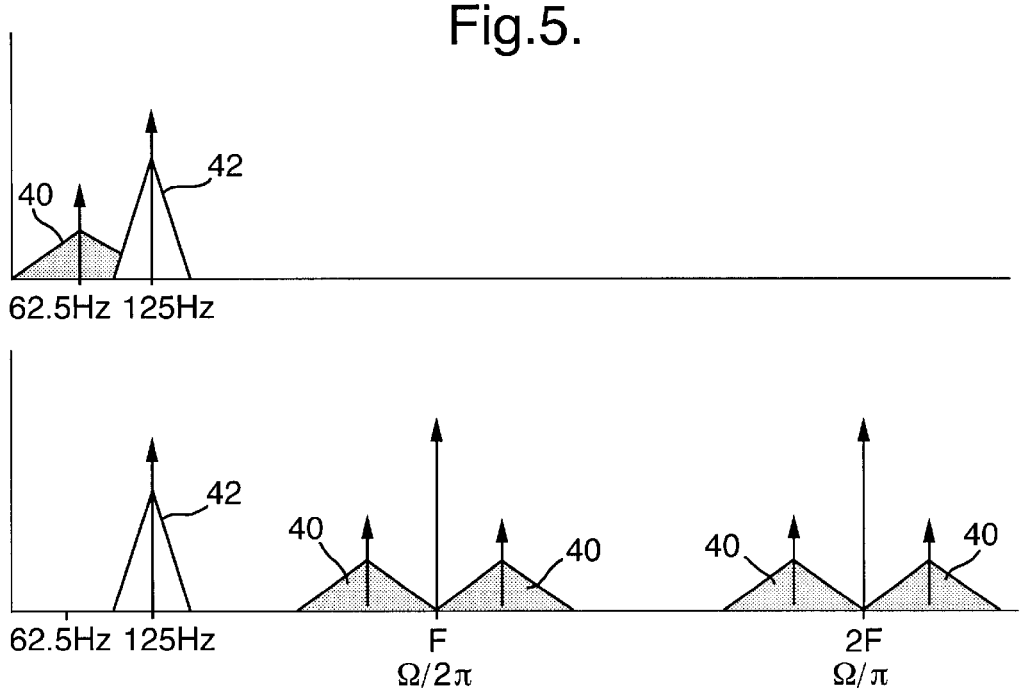
FIGS. 5A and 5B are frequency spectra showing how noise can be present in a desired alignment signal, and the effect of the present invention in alleviating the noise problem.

Equation [10] shows another feature of the present invention. In practice the position of the wafer grating is scanned at a frequency of, say, 125 Hz and the phase of the detected alignment signal gives the wafer position. From equation [7], the noise signal is normally at a sub-harmonic of the alignment signal (i.e. 62.5 Hz), but the phase noise has a width that means that it 'leaks' into the desired alignment signal. By phase modulating the incident light, the phase noise becomes centered around harmonics of the modulation frequency $\Omega$ (the last two terms on the right-hand side of equation [10] which are multiplied by the $\sqrt{R}$ noise term in equation [7]). This is illustrated schematically in FIG. 5, which shows that the frequency spectrum of the phase noise 40 becomes shifted towards the high-frequency region, where is can no longer deteriorate the alignment signal 42. If necessary, the detected signal can be filtered.

The use of phase modulation is attractive because it does not require significant redesign of the alignment system. No demodulation is necessary on the detector side; it is only necessary to include a phase modulator in the illumination beam on the source side. The choice of phase modulator depends on the particular application. For example, from equation [11], for a modulator that can achieve a phase amplitude modulation of a few radians, in a system with Z of a few tens of mm, the modulation frequency must be of the order of a few GHz. This is achievable with electro-optic elements, such as a $LiNbO_3$ phase modulator. The illumination source does not have to be a HeNe laser, but can be a solid-state laser, such as a laser diode, and the source may be directly phase-modulatable. In an exemplary system, an RF signal generator produces a GHz signal that is fed to a RF power amplifier which then drives an electro-optic phase modulator through which the interferometer incident radiation is passed.

The term "phase modulation" has been used to describe the effect of multiplying the complex amplitude of a radiation beam by a term to vary its phase. An example of such a term is given in equation [2] in which the phase modulation is harmonic and has a particular frequency and amplitude. However, it can be shown that modulating the state-of-polarization of the radiation is in fact a generalization of such phase modulation, and therefore the expression "phase modulation" herein should be understood in this broad sense. Varying the state-of-polarization effectively modulates the phase of the different polarization components (such as horizontal and vertical components, the elements of the Jones vector for a beam) with respect to each other. Harmonically varying the state-of-polarization, such as with a birefringent electro-optic element, produces the same result as analyzed above.

EMBODIMENT 4

As can be seen from equation [11], the phase modulation required to cancel a spurious noise term depends on the value of Z; thus the above specific solution is only 100% effective for a specific spurious reflection. In practice though it is not necessary to measure Z directly; instead the apparatus can be set up and the phase modulation tuned to minimize noise. In fact, because there are two degrees of freedom, the phase modulation amplitude and modulation frequency, it is possible to eliminate completely two different spurious reflections.

Further embodiments of the invention will now be described; firstly an embodiment by which it is possible to eliminate a greater number of spurious reflection signals, and secondly an embodiment by which spurious signals can be eliminated for a range of Z values, thereby removing the need to know the position of the interface from which each spurious reflection arises, and removing the need to customize the phase modulation for each particular system with which the invention is used.

Figure 3A:
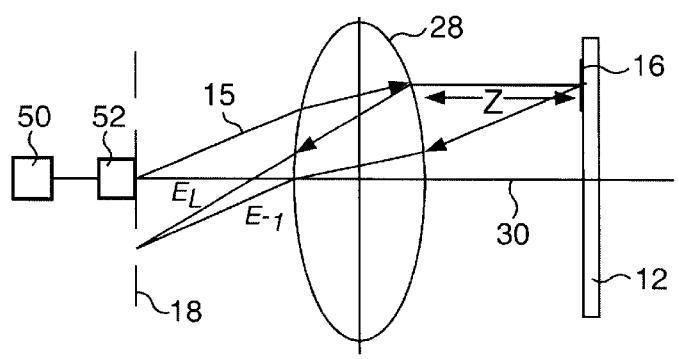
FIGS. 3A and 3B illustrate a problem with the apparatus, which is addressed by the present invention.
Figure 3B:
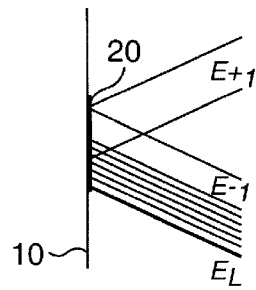
Figure 6:
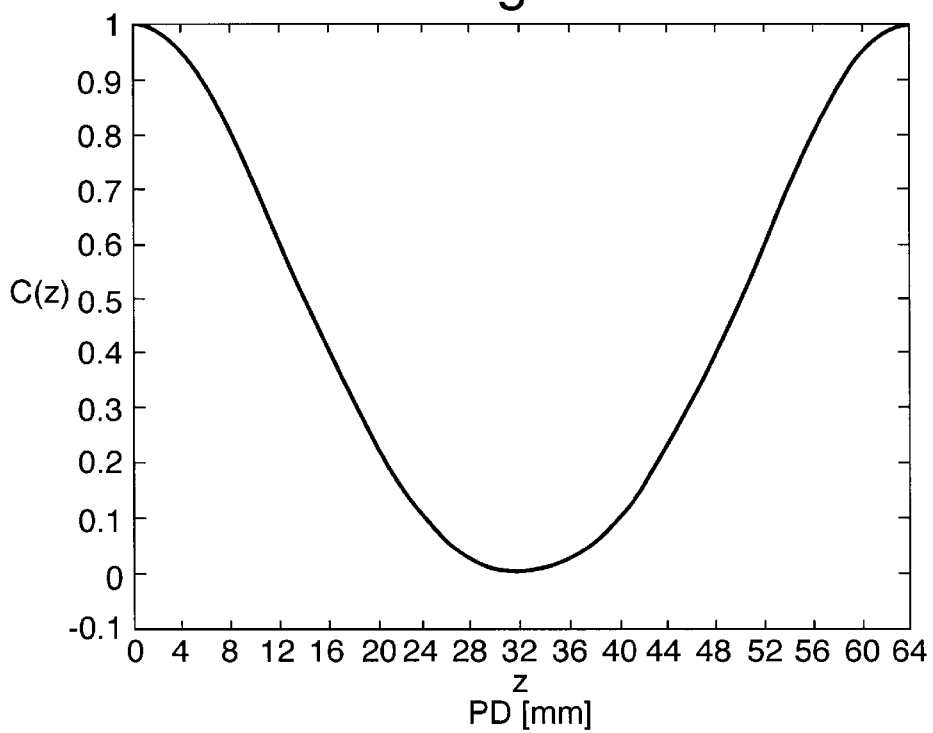
FIGS. 6, 7 and 8 illustrate the effects of reduced fringe contrast, and hence noise interference suppression, for different further embodiments of the invention.

If the laser beam in the interferometer is phase-modulated with amplitude $m_1$, the fringe contrast (C) of the interference pattern is given by:

$$C(z) = J_0\left(m_1 \sqrt{2 - 2\cos\left(\Omega \frac{z}{c}\right)}\right)$$

where z is the optical path difference (PD) of the interfering beams (in the apparatus of FIGS. 2 and 3, $z \approx 2Z$). The velocity of light, and the angular modulation frequency are, respectively, c and $\Omega$. $J_0$ is a zero-order Bessel function. A lot of C(z) is given in FIG. 6 for $\Omega/2\pi=4.7$ GHz and $m_1=1.2$ rad. It can be seen that the fringe contrast is reduced to 0 for z=32 mm. In other words, a spurious interference between two beams with an PD of 32 mm is not visible.

Figure 7:
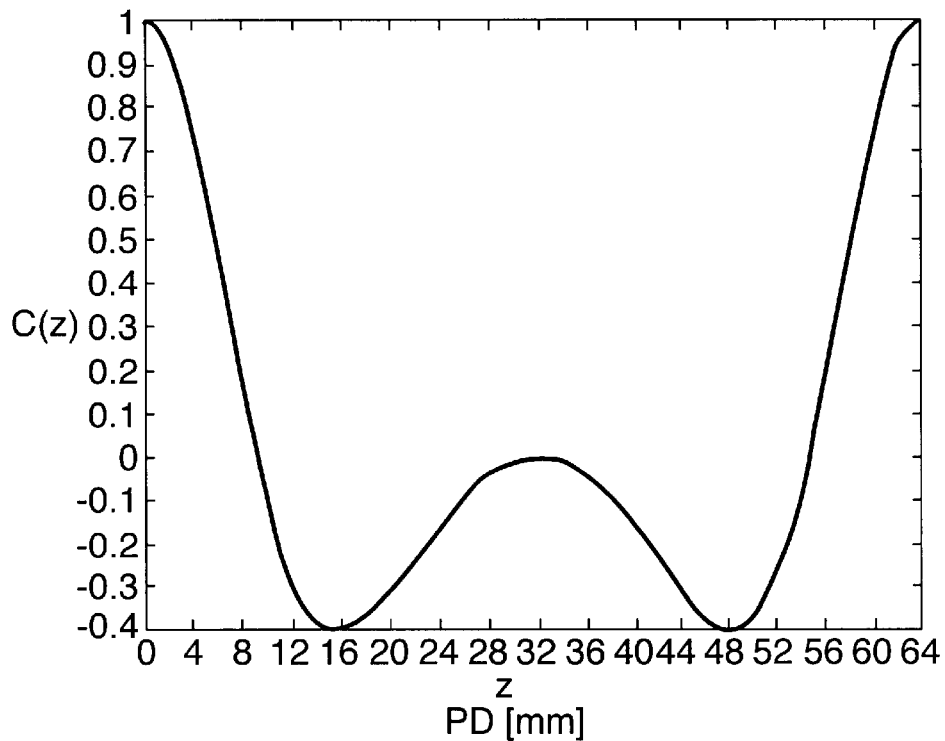

If the modulation depth $m_1$ is increased to 2.75 radians, a contrast C(z) as shown in FIG. 7 is obtained. For PD's between 9 and 54 mm, the contrast of the fringes is actually reversed: C(z)<0.

Periodically switching the modulation amplitude between two modulation amplitudes $m_1$ and $m_2$, causes the contrast C also to be switched between two corresponding values $C_1$ and $C_2$. If the switching frequency is sufficiently high (for example≈1 Mhz), the contrast that is actually observed is the weighted average of the two contrast values, because the response of the detector is significantly slower. So if the duty cycle of the block-shaped switching frequency is d, the observed contrast C becomes:

$$C(z)=dC_1(z)+(1-d)C_2(z)$$

With this "amplitude switching" technique, there are two further degrees of freedom: 1. The amplitude $m_2$ of the second phase modulation 2. The weight factor (i.e. the duty cycle of the switching signal) d.

Figure 8:
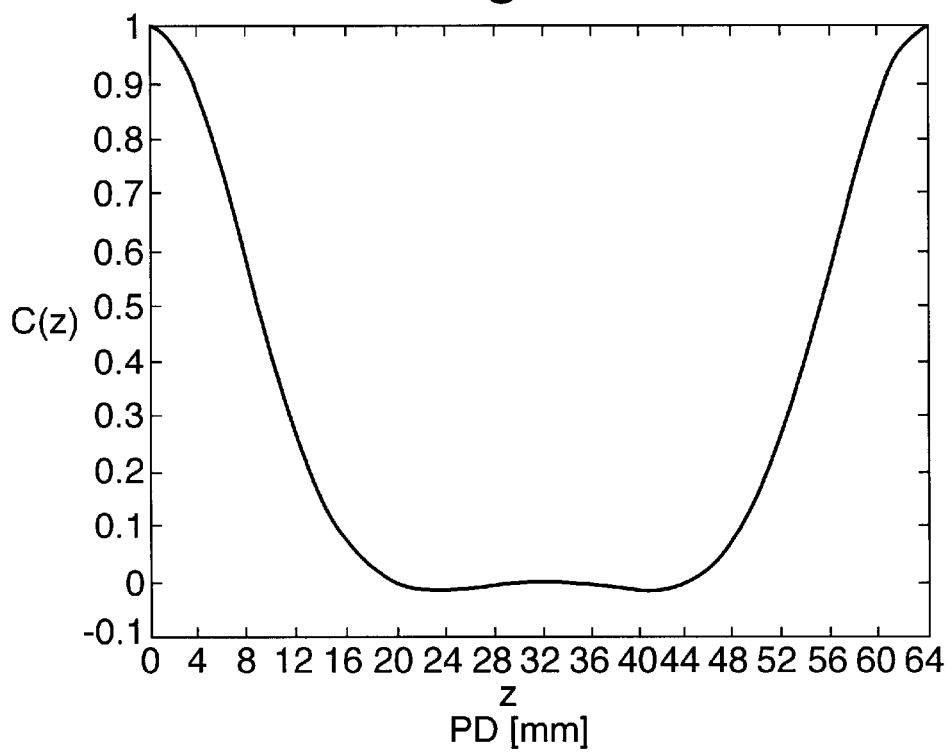

An example of the resulting fringe contrast using an amplitude-switched phase modulator is shown in FIG. 8 for $m_1=1.0$ rad, $m_2=2.45$ rad and d=0.48. It can be seen that, in this particular example, spurious reflections with PDs in the range of about 16 to 48 mm are all almost totally eliminated.

Figure 9:
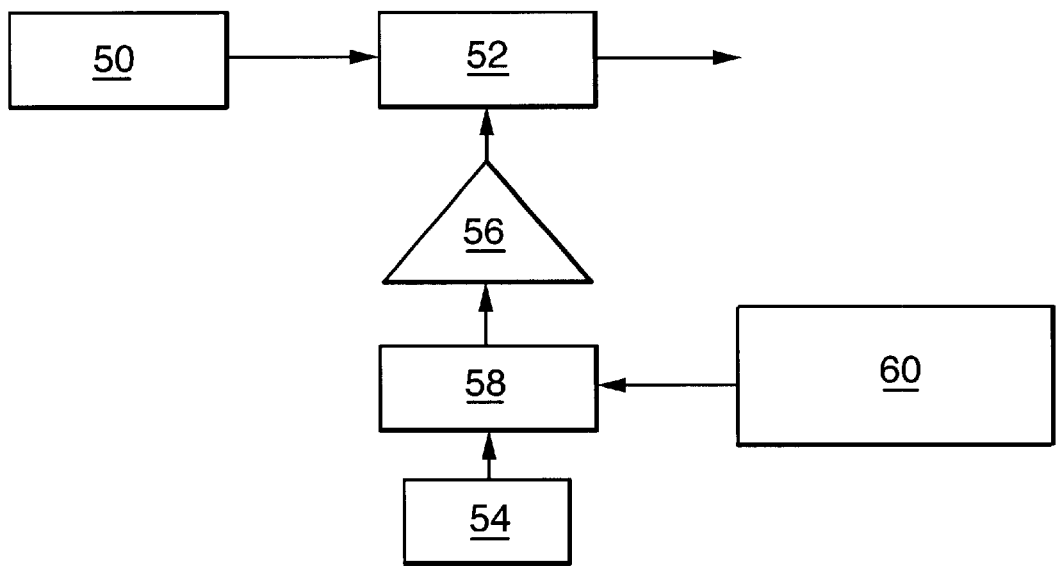
FIG. 9 illustrates a phase modulator arrangement according to an embodiment of the invention.

Implementing this phase modulation amplitude switching aspect of the invention is only marginally more complex than the previously described phase modulator. Referring to FIG. 9, an embodiment of the phase modulation invention has a laser 50 and a $LiNbO_3$ electro-optic phase modulator 52 through which the laser beam is transmitted. The phase modulator 52 is driven by the signal from a 4.7 GHz RF signal generator 54 via an RF power amplifier 56. This basic system is modified to achieve amplitude switching by passing the RF signal though a current-controlled attenuator 58 which is driven by the signal from a switching signal source 60. The switching signal source 60 is a 1 MHz signal generator with programmable duty-cycle, which outputs a rectangular wave pattern.

Although the above described amplitude switching is at quite high frequency, the bandwidth of a resonant $LiNbO_3$ phase modulator is about 25 MHz at 4.7 GHz modulation frequency, therefore a 1 MHz switching frequency is achievable with these optical components.

EMBODIMENT 5

In particular applications, a single pass of the coherent light beam through the phase modulator may be insufficient to produce a desired amplitude of phase modulation. In that case, a number of alternative scenarios can be considered. For example:

(1) One could consider passing the light beam more than once through the phase modulator. This can, for example, be achieved by retro-reflecting a phase-modulated beam with a simple mirror; if the second passage is properly delayed, the amplitude of the phase modulation will be doubled.

(2) One can employ a Faraday Isolator, which consists of a rotor sandwiched between two polarizing beamsplitters (PBSs). By orienting the two PBSs at 45° relative to each other, the Faraday Isolator will act as an optical diode. Light from the coherent source is passed through the Faraday Isolator on its way to the phase modulator; after passage through the phase modulator, the light is reflected back into the phase modulator and Faraday Isolator for a second time, whence the emerging light is "double-modulated".

This invention can, of course, be extended to more degrees of freedom, for example by using other switching waveforms, more switching levels and so on.

Whilst specific embodiments of the invention have been described above it will be appreciated that the invention may be practiced otherwise than described.

What is claimed is:

1. A lithographic projection apparatus comprising:

a radiation system for supplying a projection beam of radiation;

a mask table provided with a mask holder for holding a mask;

a substrate table provided with a substrate holder for holding a substrate;

a projection system for imaging a portion of the mask irradiated by said projection beam onto a target portion of the substrate;

an optical measurement system having:
  (i) a source of coherent radiation;
  (ii) a phase modulator arranged to produce a measurement beam having a continuously varying phase by modulating the phase of radiation received from said source, and
  (iii) a signal detector that detects a desired signal resulting from interference between beams derived from said measurement beam, wherein detection of at least one spurious signal caused by interference from at least one spurious beam in an optical beam path between the phase modulator and the detector, is suppressed.

2. An apparatus according to claim 1, wherein the frequency of said phase modulation is selected to shift the frequency of said spurious signal relative to the frequency of said desired signal.

3. An apparatus according to claim 1, wherein the modulation amplitude and frequency of said phase modulation are selected to reduce the amplitude of said spurious signal.

4. An apparatus according to claim 1, wherein said phase modulator comprises a state-of-polarization controller.

5. An apparatus according to claim 1, wherein said phase modulator further comprises a controllable attenuator for sequentially modulating said coherent radiation at a plurality of modulation amplitudes.

6. An apparatus according to claim 5, wherein the phase modulator further comprises switching means for sequentially switching between said plurality of modulation amplitudes at a predetermined duty cycle.

7. An apparatus according to claim 1, wherein the modulation frequency (F) and modulation amplitude ($\hat{\varphi}_L$) of said phase modulation satisfy the following relation:

$$\hat{\varphi}_L = \frac{2.4}{\sqrt{2 - 2\cos\left(4\pi F \frac{Z}{c}\right)}}$$

where Z is a distance particular to the apparatus.

8. An apparatus according to claim 1, wherein the phase modulation frequency is higher than the frequency of the said desired signal.

9. An apparatus according to claim 1, wherein the phase modulation frequency is greater than 1 GHz.

10. An apparatus according to claim 1, wherein said phase modulator comprises an electro-optic element.

11. An apparatus according to claim 1, wherein the said optical measurement system is comprised in an alignment system for mutually aligning the mask and the substrate.

12. An apparatus according to claim 1, wherein the said optical measurement system is comprised in a leveling system for leveling at least one of the mask and the substrate with respect to the projection beam.

13. An apparatus according to claim 1, wherein the said optical measurement system is comprised in a stage-position-measurement system for determining at least one of the position, velocity and acceleration of at least one of the mask and substrate tables.

14. A lithographic projection apparatus comprising:

a radiation system for supplying a projection beam of radiation;

a mask table provided with a mask holder for holding a mask;

a substrate table provided with a substrate holder for holding a substrate;

a projection system for imaging a portion of the mask irradiated by said projection beam onto a target portion of the substrate;

an optical measurement system having:
  (i) a source of coherent radiation;
  (ii) an electro-optic modulator arranged to produce a measurement beam having a continously varying phase by modulating the phase of radiation received from said source, and
  (iii) a signal detector that detects a desired signal resulting from interference between beams derived from said measurement beam, wherein detection of at least one spurious beam in an optical beam path between the phase modulator and the detector, is suppressed.

* * * * *